(12) United States Patent
Lai et al.

(10) Patent No.: US 6,548,406 B2
(45) Date of Patent: Apr. 15, 2003

(54) METHOD FOR FORMING INTEGRATED CIRCUIT HAVING MONOS DEVICE AND MIXED-SIGNAL CIRCUIT

(75) Inventors: Erh-Kun Lai, Taichung (TW); Hsin-Huei Chen, Miao-Li (TW); Ying-Tso Chen, Kaohsiung (TW); Shou-Wei Hwang, Chilung (TW); Yu-Ping Huang, Taichung (TW)

(73) Assignee: Macronix International Co., Ltd. (TW)

( * ) Notice: Subject to any disclaimer, the term of this patent is extended or adjusted under 35 U.S.C. 154(b) by 61 days.

(21) Appl. No.: 09/930,998

(22) Filed: Aug. 17, 2001

(65) Prior Publication Data

US 2003/0036275 A1 Feb. 20, 2003

(51) Int. Cl.$^7$ .............................................. H01L 21/302
(52) U.S. Cl. ................ 438/689; 438/694; 438/702; 438/706; 438/737; 438/738
(58) Field of Search .................. 438/689, 694, 438/702, 706, 737, 738

(56) References Cited

U.S. PATENT DOCUMENTS

| | | | | | |
|---|---|---|---|---|---|
| 5,008,214 | A | * | 4/1991 | Redwine | 438/243 |
| 5,364,813 | A | * | 11/1994 | Koh | 438/397 |
| 5,591,664 | A | * | 1/1997 | Wang et al. | 438/254 |
| 5,705,438 | A | * | 1/1998 | Tseng | 438/238 |
| 5,731,130 | A | * | 3/1998 | Tseng | 430/316 |
| 5,766,994 | A | * | 6/1998 | Tseng | 438/254 |
| 6,417,047 | B1 | * | 7/2002 | Isobe | 438/258 |
| 6,468,865 | B1 | * | 10/2002 | Yang et al. | 438/262 |
| 6,468,919 | B2 | * | 10/2002 | Chien et al. | 438/719 |
| 2002/0136989 | A1 | * | 9/2002 | Lin | 430/614 |

* cited by examiner

Primary Examiner—Benjamin L. Utech
Assistant Examiner—Vanessa Perez-Ramos

(57) ABSTRACT

A method for forming an integrated circuit having metal-oxide nitride-oxide semiconductor (MONOS) memories and mixed-signal circuits is disclosed. The invention integrates non-volatile memory devices such as MONOS devices and logic devices such as MOS devices as well as PIP capacitors into SOC devices with reduced process steps.

20 Claims, 6 Drawing Sheets

METHOD FOR FORMING INTEGRATED CIRCUIT HAVING MONOS DEVICE AND MIXED-SIGNAL CIRCUIT

BACKGROUND OF THE INVENTION

1. Field of the Invention

The present invention relates to a method for forming an integrated circuit, and more particularly to a method for forming an integrated circuit having metal-oxide nitride-oxide semiconductor (MONOS) memories and mixed-signal circuits.

2. Description of the Related Art

In view of the demand of high integration and various applications of modern semiconductor devices, system on a chip (SOC) devices have been widely introduced, in which many devices having various functions such as logic devices and memory devices are integrated into one chip so that they interactively operate. Owing to the various different processes for forming logic devices such as metal oxide semiconductor (MOS)devices and memory devices such as non-volatile memory devices, it is much complicated and difficult to manufacture SOC devices having logic devices and memory devices. In order to integrate two or more different kinds of devices separately having different functions into one chip, it is necessary to develop processes that are compatible for various devices.

An embedded memory logic (EML) device, which is a type of SOC device, is obtained by integrating memory devices and logic devices into one chip. A whole EML device is a combination of a cell array region and a logic circuit region. Usually, a plurality of memory cells are located in the cell array region and data stored in the cell array region are computed or operated by the logic circuit. Typical memory cells such as DRAM cells, SRAM cells are widely used.

However, non-volatile memory cells such as NROM (Nitride Read-Only Memory) cells or MONOS memory cells are rarely integrated into SOC devices. FIG. 1A shows a MONOS memory cell fabricated on a substrate 100. In FIG. 1A, an oxide layer 102, a nitride layer 104 and an oxide layer 106 comprise an ONO (Oxide-Nitride-Oxide) layer. A polysilicon layer 108 used as the "metal" of the MONOS are also in FIG. 1A. FIG. 1B shows a MOS device formed on a substrate 120. The MOS device comprises a gate oxide layer 122, a polysilicon gate electrode 124 and source/drain regions 126a and 126b. FIG. 1C shows a PIP (Polysilicon-Insulator-Polysilicon )capacitor formed on a substrate 130, wherein the PIP capacitor comprises an oxide layer 132, a polysilicon electrode 134, an oxide layer 136 used as the insulator and a polysilicon gate 138. MOS devices and PIP capacitors can constitute a mixed-signal circuit. It is noted that the MONOS device, the MOS device and the PIP capacitor have not only distinct structures and operating principles from each other, but also different process steps. In view of the various demands of manufacturing SOC devices such as reducing the production cost, integrating various process steps and upgrading the yield ratio, it is necessary to provide an improved process integration technology to meet the requirements of modern SOC manufacture. It is toward this goal that the invention especially directs.

SUMMARY OF THE INVENTION

It is therefore an object of the invention to provide a new process integration technology that can integrate MONOS devices, MOS devices and PIP capacitors into SOC devices.

It is another object of this invention to provide a method for forming SOC devices comprising MONOS devices, MOS devices and PIP capacitors with reduced process steps.

It is a further object of this invention to provide a method for forming SOC devices with reduced production cost, integrated process steps and upgraded yield ratio.

To achieve these objects, and in accordance with the purpose of the invention, the invention uses a method comprising: providing a substrate having an array region having a first dielectric layer, a second dielectric layer and a third dielectric layer stacked in sequence and a periphery region having said first dielectric layer thereon; forming a first conductive layer; forming a photoresist layer over said array region; implanting dopant ions into said first conductive layer; removing said photoresist layer; patterning to etch said first conductive layer to form a second conductive layer and a third conductive layer on said periphery region; removing said third dielectric layer to expose said second dielectric layer and said exposed first dielectric layer on said periphery region to expose said substrate; oxidizing said second dielectric layer, said substrate, said second conductive layer and said third conductive layer to form a fourth dielectric layer therein; forming a fourth conductive layer over said fourth dielectric layer; and patterning to etch said fourth conductive layer to a fifth conductive layer on said array region and a sixth conductive layer on said fourth dielectric layer and said third conductive layer. Said substrate can also has an array region having a first dielectric layer, a second dielectric layer and a third dielectric layer stacked in sequence and a periphery region having a dielectric layer thereon. The dielectric layer can be formed on the periphery region after etching the first dielectric layer, the second dielectric layer and the third dielectric layer.

The invention integrates non-volatile memory devices such as a MONOS device and a logic device such as a MOS device as well as a PIP capacitor into a SOC device with reduced process steps. The invention uses the first dielectric layer comprising a silicon dioxide layer as the first oxide layer of the MONOS device, the gate oxide layer of the MOS device and the bottom insulating layer of the PIP capacitor, thereby reduces the process steps. Moreover, the invention utilizes the first conductive layer comprising a polysilicon layer as the gate electrode of the MOS device and the resistor poly (RPOLY) of the PIP capacitor, and an N-type implantation or P-type implantation to adjust the conductivities of the gate electrode and the RPOLY at the same time. Thus less process steps are needed. Furthermore, the invention uses an oxidation process which is not sensitive to the substrate to form the top oxide layer of the MONOS and the insulating layer of the PIP capacitor, thereby avoid any reliability problem resulting from the etching damages of the third dielectric layer and leakage current resulting from the contact of the second dielectric layer and the fourth conductive layer, meanwhile, form the fourth dielectric layer used as the insulating layer of the PIP capacitor. The oxidation process which is not sensitive to the substrate can also be used to reoxidiz the polysilicon gate of the MOS device to reduce the leakage current. The invention also utilizes the fourth conductive layer to form the fifth conductive layer used as the metal of the MONOS device and the sixth conductive layer used as the GPOLY of the PIP capacitor, therefore the processes used to individually form the metal of the MONOS device and the GPOLY of the PIP capacitor are integrated and reduced.

It is to be understood that both the foregoing general description and the following detailed description are exemplary and explanatory only and are not restrictive of the invention, as claimed.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

It is to be understood and appreciated that the process steps and structures described below do not cover a complete process flow. The present invention can be practiced in conjunction with various integrated circuit fabrication techniques that are used in the art, and only so much of the commonly practiced process steps are included herein as are necessary to provide an understanding of the present invention.

The present invention will be described in detail with reference to the accompanying drawings. It should be noted that the drawings are in greatly simplified form and they are not drawn to scale. Moreover, dimensions have been exaggerated in order to provide a clear illustration and understanding of the present invention.

Figure 1A:
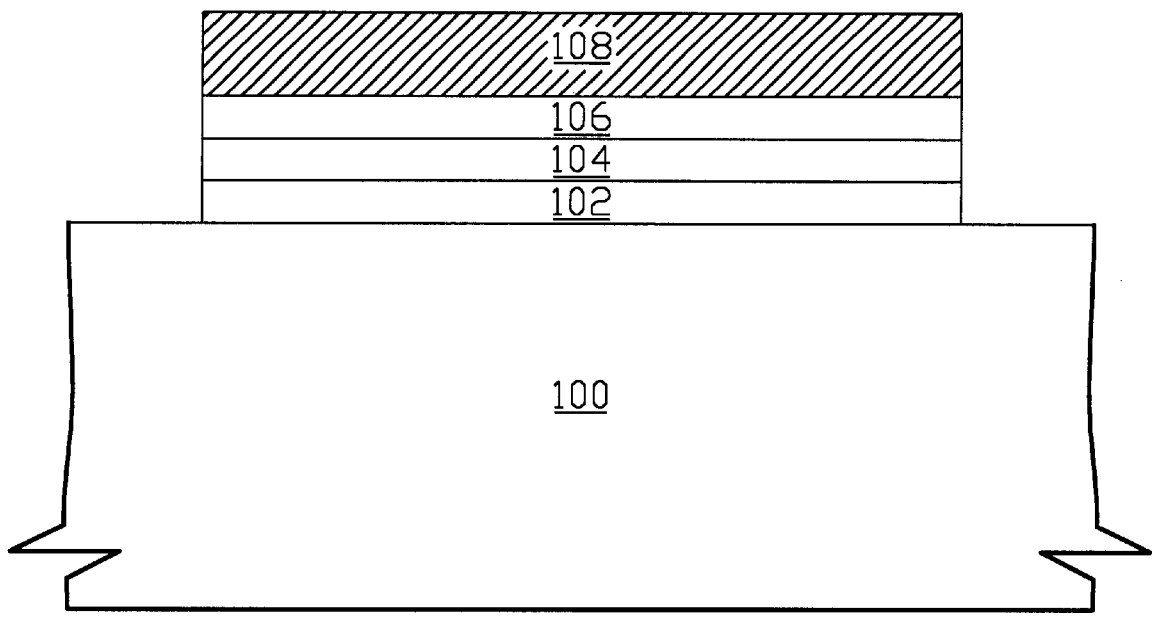
FIG. 1A shows a cross-sectional diagram of a MONOS memory cell fabricated on a substrate.
Figure 1B:
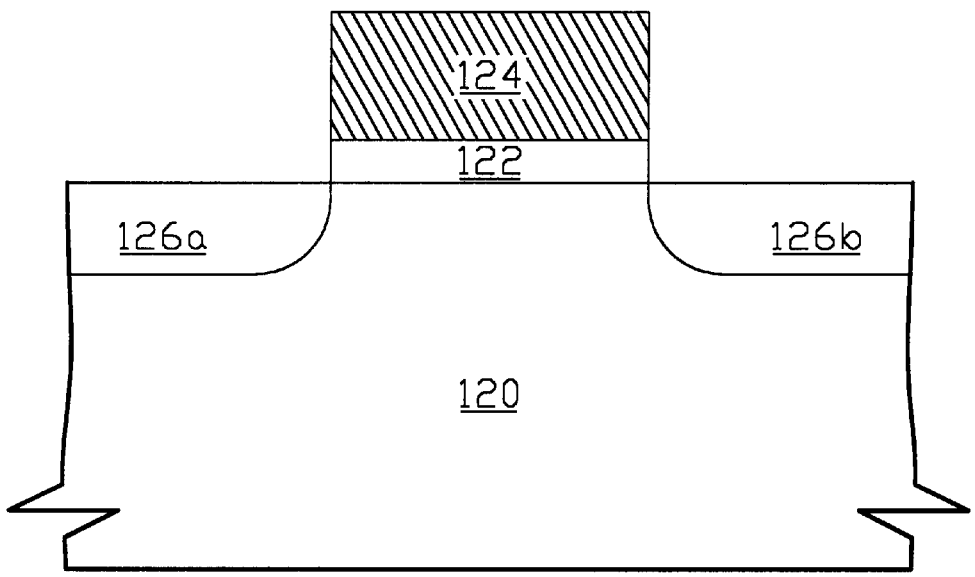
FIG. 1B shows a schematic cross-sectional diagram of a MOS device formed on a substrate.
Figure 1C:
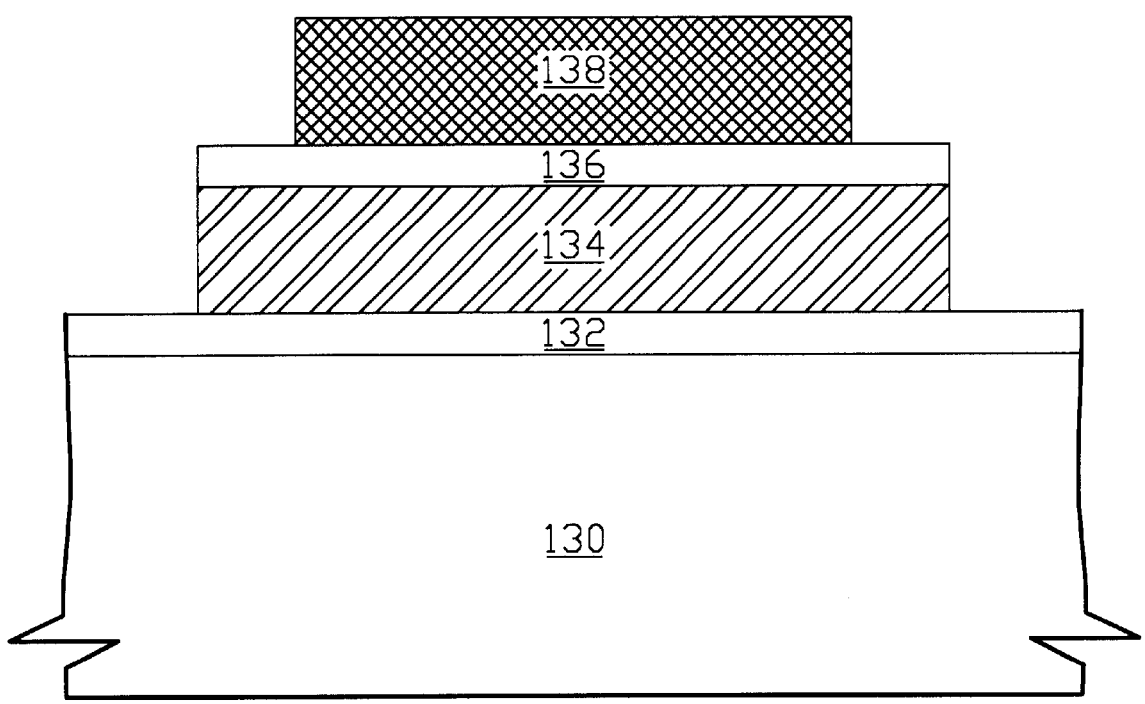
FIG. 1C shows a schematic cross-sectional diagram of a PIP capacitor formed on a substrate.
Figure 2A:
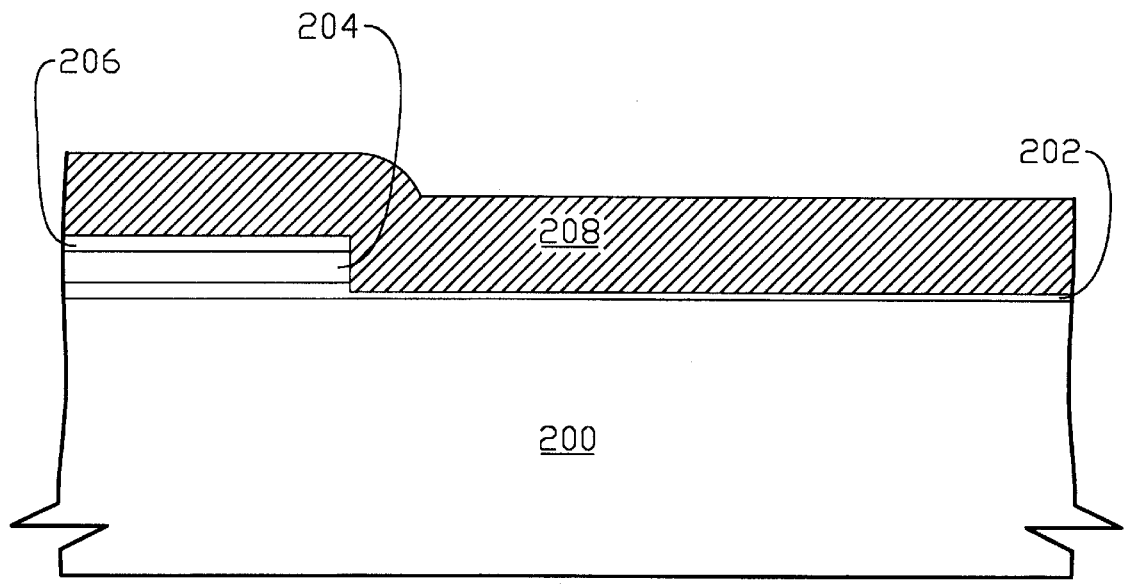
FIG. 2A shows a substrate having a sandwich layer on a region of array, a periphery region and a conductive layer thereon.

Referring to FIG. 2A, a substrate 200 having a region of array used to form MONOS devices thereon and a periphery region used to form logic devices thereon is shown. The substrate 200 preferably comprises, but is not limited to: a silicon substrate with a <100> crystallographic orientation. The array region has a sandwich layer comprising dielectric layers 202, 204 and 206 which preferably comprises an ONO (Oxide-Nitride-Oxide) layer. The periphery region also has the dielectric layer 202 thereon. The dielectric layer 202 comprising a silicon dioxide layer can be formed by using conventional methods such as a thermal oxidation process. It is noted that the dielectric layer 202 is used as the bottom oxide layers of MONOS devices and the gate oxide layers of MOS devices in this invention. Thus the thickness of the dielectric layer 202 may be different on the array region and the periphery region, and it depends on the need. For example, the dielectric layer 202 has a thickness of from about 50 angstrom to about 90 angstrom in the array region, and a thickness of from about 20 angstrom to about 200 angstrom in the periphery region. Moreover, the dielectric layer 202 preferably has a thickness of about 70 angstrom in the array region and a thickness of about 20–70 angstrom in the periphery region. The thickness difference of the dielectric layer 202 between the array region and the periphery region can be achieved by conventional methods such as etching and photolithography processes. The thickness difference can also be achieved by removing the ONO layer on the periphery region and then forming a dielectric layer on the periphery region. In order to form the dielectric layer 204 comprising a silicon nitride layer and the dielectric layer 206 comprising a silicon dioxide layer on the array region only, conventional methods such as chemical vapor deposition, etching and photolithography processes can be used. The dielectric layer 204 has a thickness of from about 50 angstrom to about 200 angstrom and it preferably has a thickness of about 130 angstrom. The dielectric layer 206 has a thickness of from about 20 angstrom to about 200 angstrom, and it preferably has a thickness of about 80 angstrom. As shown in FIG. 2A, a conductive layer 208 is formed over both the array region and the periphery region. The conductive layer 208 preferably comprises a polysilicon layer formed by conventional method such as chemical vapor depositions.

Figure 2B:
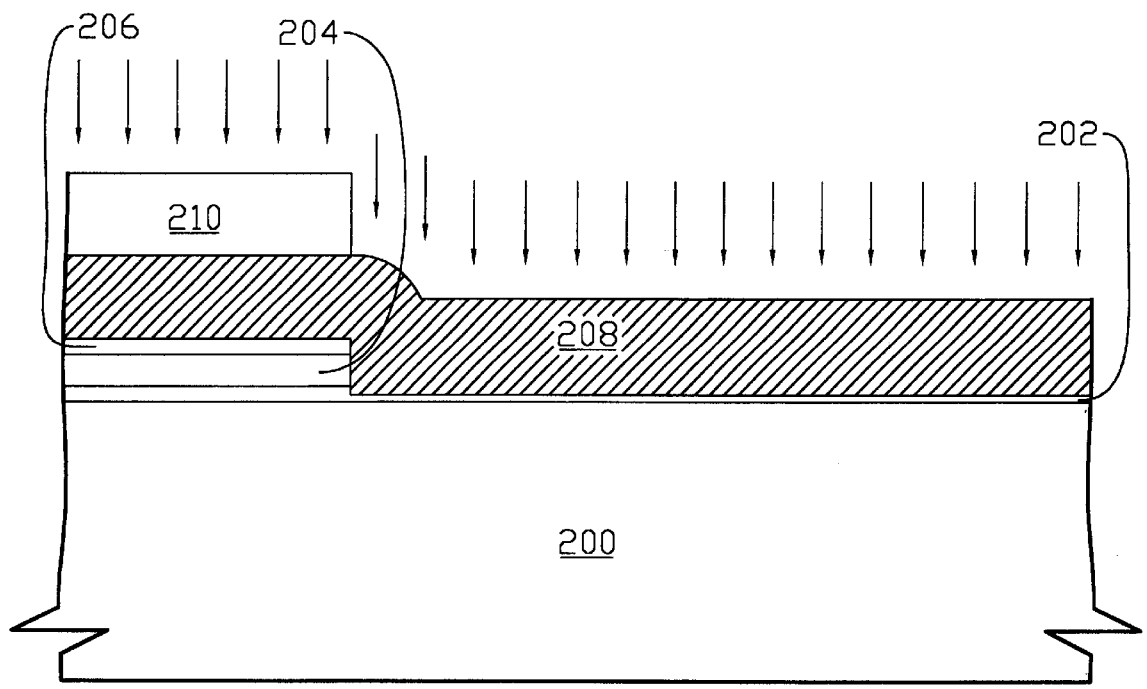
FIG. 2B shows an implantation process performed on the structure shown in FIG. 2A.

Referring to FIG. 2B, the structure shown in FIG. 2A is patterned by conventional photolithography methods and a photoresist layer 210 is formed to cover the array region. An N-type implantation (or a P-type implantation is performed on the structure to implant n-type dopants such as phosphorus ions or p-type dopants such as boron ions into the exposed conductive layer 208 to adjust the conductivity thereof. The N-type implantation is performed for NMOS and the P-type implantation is for PMOS, and the N-type implantation and the P-type implantation are performed with separate photolithography processes. It is noted that the conductive layer 208 is also prepared to use as a bottom electrode of a PIP capacitor, and the N-type implantation and the P-type implantation are also used to adjust the conductivity of the bottom electrode.

Figure 2C:
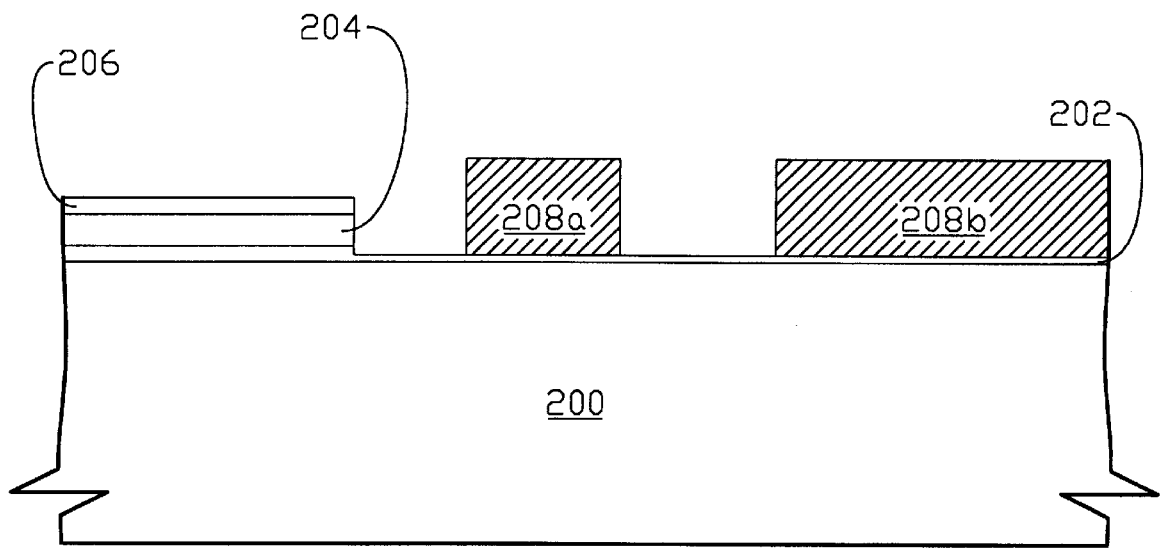
FIG. 2C shows a result of etching the conductive layer shown in FIG. 2B.

Referring to FIG. 2C, the photoresist layer 210 is removed and the conductive layer 208 is etched to form conductive layers 208a and 208b and expose the dielectric layers 202 and 206. The conductive layer 208 can be etched by conventional methods, and it is preferably etched by a dry etching such as reactive ion etching. The conductive layers 208a and 208b are separately used as a gate electrode of a MOS device and a bottom electrode of a PIP capacitor. The dielectric layer 202 is also used as the gate oxide layer of the MOS and the bottom insulating layer of the PIP capacitor. Normally, the PIP capacitor is formed on a shallow trench isolation or a field oxide layer but the PIP capacitor formed by the method of this invention can also be formed on portions of the substrate other than shallow trench isolations and field oxide layers.

Figure 2D:
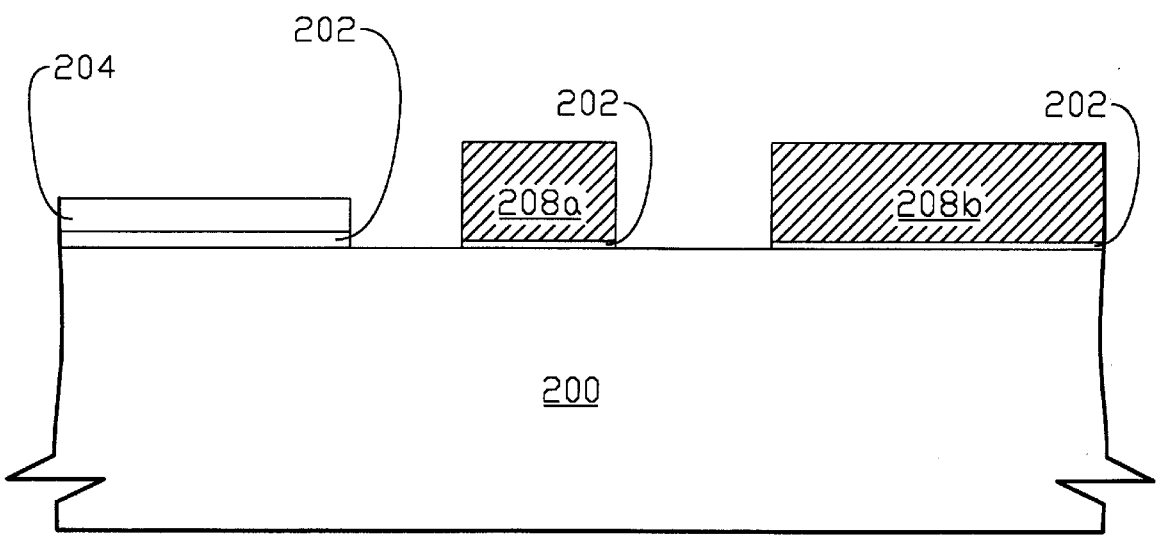
FIG. 2D shows a result of removing the top layer of the sandwich layer.

Referring to FIG. 2D, the dielectric layer 206 and the exposed portion of the dielectric layer 202 are removed by using conventional methods such as etching. The dielectric layer 206 is removed because it usually has damages resulting from the previous performed processes and the etching of the conductive layer 208.

Figure 2E:
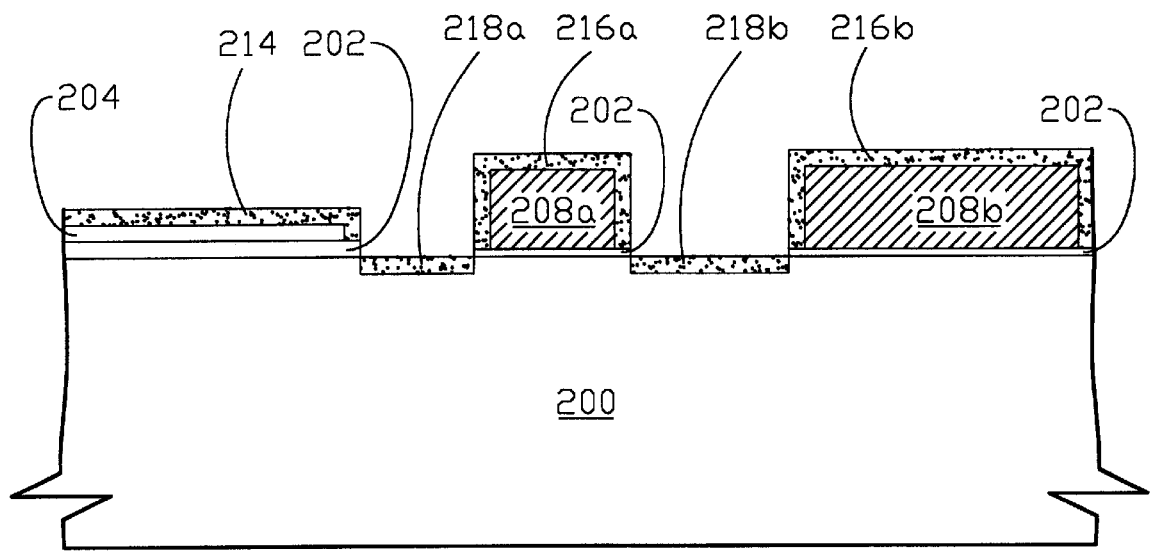
FIG. 2E shows a result of oxidizing the structure shown in FIG. 2D.

Referring to FIG. 2E, the dielectric layer 204 such as a silicon nitride layer, the substrate 200 such as a silicon substrate, the conductive layers 208a and 208b such as polysilicon layers are oxidized to form dielectric layers 214, 216a, 216b, 218a and 218b by using conventional oxidation methods such as wet oxidation. The dielectric layers 214, 216a, 216b, 218a and 218b preferably comprise silicon dioxide layers. However, the oxidation rate of the conventional wet oxidation process for silicon nitride is much lower than the oxidation rate of the same wet oxidation process for silicon, for example, the ratio of oxidation rate of silicon nitride and silicon is about 1:10. Thus an oxidation process which is not sensitive to the substrate and has a ratio of oxidation rate of silicon nitride and silicon larger than 0.6 is preferably used. The dielectric layer 204 comprising a silicon nitride layer is oxidized to convert a layer thereof into a dielectric layer 214. The dielectric layer 214 has a thickness of from about 30 angstrom to about 130 angstrom, and it preferably has a thickness of about 70 angstrom. The remaining dielectric layer 204 has a thickness of from about 60 angstrom to about 130 angstrom, and it preferably has a thickness of about 70 angstrom. The dielectric layers 216a and 216b have a thickness of from about 70 angstrom to about 110 angstrom. The dielectric layer 218a and 218b have a thickness of from about 70 angstrom to about 110 angstrom. The thickness of the dielectric layer 216a, 216b, 218a and 218b are all preferably about 40–100 angstrom. An oxidation process which is not sensitive to the substrate is used to reoxidiz the conductive layer 208a to form the dielectric layer 216a and reduce the leakage current.

Figure 2F:
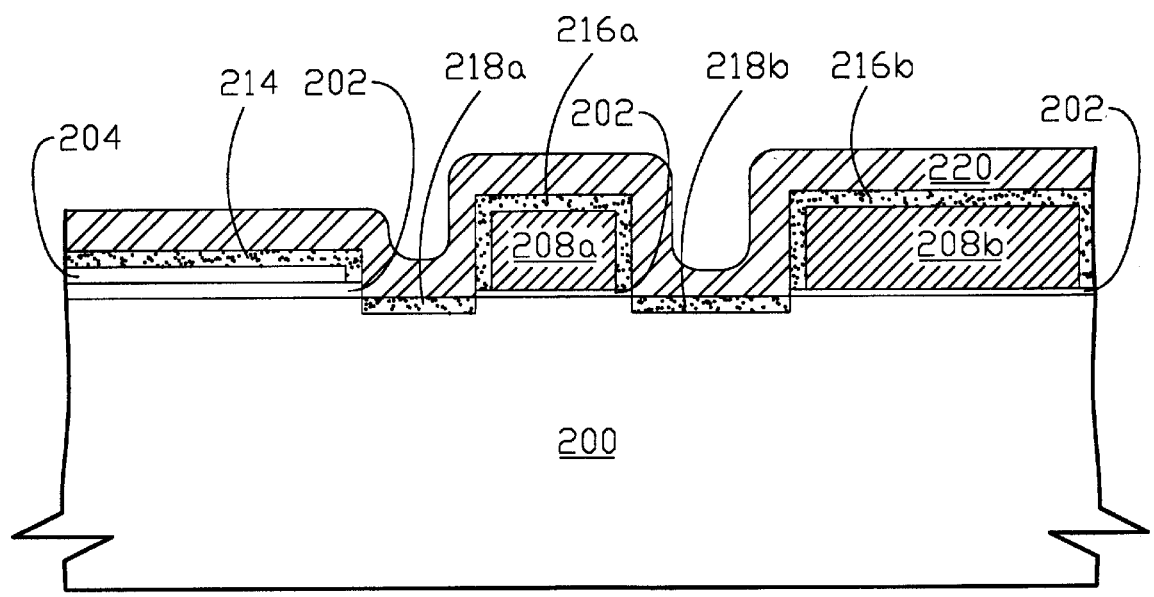
FIG. 2F shows a result of forming a conductive layer over the structure shown in FIG. 2E.

Referring to FIG. 2F, a conductive layer 220 is formed over the structure shown in FIG. 2E. The conductive layer 220 comprises a polysilicon layer and it is preferably an in situ polysilicon layer which has phosphorus dopants throughout and $WSi_x$ thereon to reduce the resistance. The conductive layer 220 can be formed by using conventional methods such as chemical vapor deposition. However, a low pressure chemical vapor deposition process is preferably used. The conductive layer 220 comprising a polysilicon layer is used as the metal of the MONOS device and the upper electrode known as gate poly (GPOLY) of the PIP capacitor.

Figure 2G:
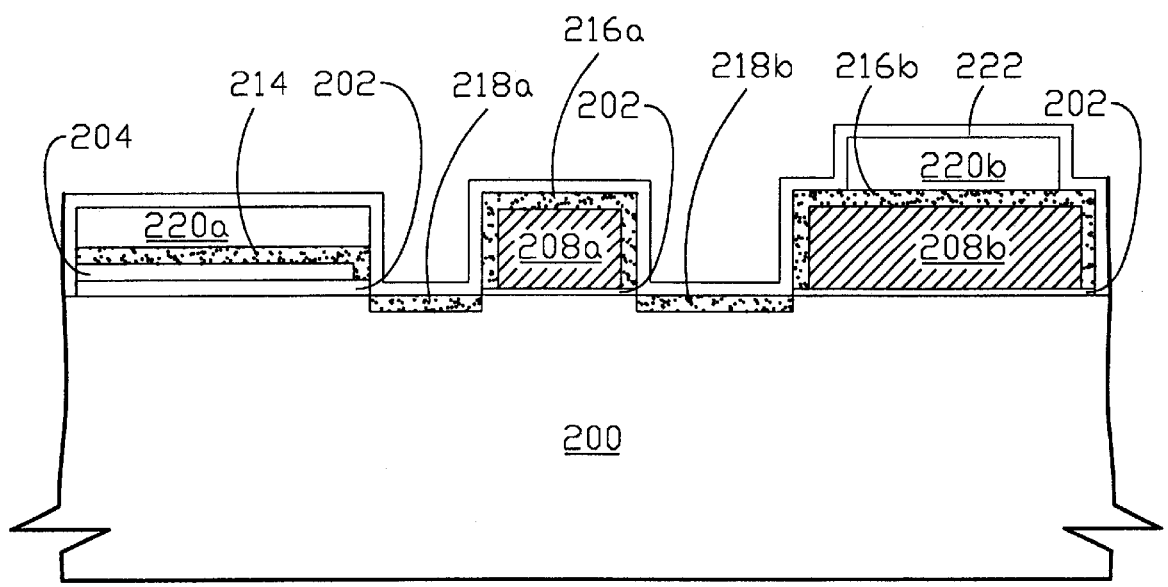
FIG. 2G shows a result of etching the conductive layer shown in FIG. 2F.

Referring to FIG. 2G, the conductive layer 220 is etched to form conductive layers 220a and 220b by conventional photolithography and etching methods. An isotropic etching such as reactive ion etching is preferably used. The conductive layers 220a and 220b are separately used as the metal of the MONOS device and the GPOLY of the PIP capacitor. Then an oxidation process which is not sensitive to the substrate is performed to form a dielectric layer 222 over the substrate 200 to reduce the leakage current. The dielectric layer 222 comprises a silicon dioxide layer.

The invention integrates non-volatile memory devices such as MONOS devices and logic devices such as MOS devices as well as PIP capacitors into SOC devices with reduced process steps. The invention uses the dielectric layer 202 comprising a silicon dioxide layer as the first oxide layer of the MONOS device, the gate oxide layer of the MOS device and the bottom insulating layer of the PIP capacitor, thereby reduces the process steps. Moreover, the invention utilizes the conductive layer 208 comprising a polysilicon layer as the gate electrode of the MOS device and the resistor poly( RPOLY )of the PIP capacitor, and N-type implantation or P-type implantation to adjust the conductivities of the gate electrode and the RPOLY at the same time. Thus less process steps are needed. Furthermore, the invention uses an oxidation process which is not sensitive to the substrate to form the dielectric layer 214 used as the top oxide layer of the MONOS and the dielectric layer 216b used as the insulating layer of the PIP capacitor, thereby avoid any reliability problem resulting from the etching damages of the dielectric layer 206, meanwhile, form the dielectric layer 216b used as the insulating layer of the PIP capacitor. The invention also utilizes the conductive layer 220 to form the conductive layer 220a used as the metal of the MONOS device and the conductive layer 220b used as the GPOLY of the PIP capacitor, therefore the processes used to individually form the metal of the MONOS device and the GPOLY of the PIP capacitor are integrated and reduced.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claim is:

1. A method for forming an integrated circuit having metal-oxide nitride-oxide semiconductor memories and mixed-signal circuits, said method comprising:

providing a substrate having an array region having a first dielectric layer, a second dielectric layer and a third dielectric layer stacked in sequence and a periphery region having said first dielectric layer thereon;

forming a first conductive layer over said array region and said periphery region;

forming a photoresist layer over said array region;

implanting dopant ions into said first conductive layer;

removing said photoresist layer;

patterning to etch said first conductive layer to form a second conductive layer and a third conductive layer on said periphery region;

removing said third dielectric layer to expose said second dielectric layer;

removing said exposed first dielectric layer on said periphery region to expose said substrate;

oxidizing said second dielectric layer, said substrate, said second conductive layer and said third conductive layer to form a fourth dielectric layer therein;

forming a fourth conductive layer over said fourth dielectric layer; and patterning to etch said fourth conductive layer to form a fifth conductive layer on said array region and a sixth conductive layer on said fourth dielectric layer and said third conductive layer.

2. The method according to claim 1, wherein said first dielectric layer, said second dielectric layer and said third dielectric layer comprise a silicon dioxide-silicon nitride-silicon dioxide layer.

3. The method according to claim 1, wherein said first conductive layer comprises a polysilicon layer.

4. The method according to claim 1, wherein said dopant ions comprise n-type dopant ions.

5. The method according to claim 1, wherein said dopant ions comprise p-type dopant ions.

6. The method according to claim 1, wherein the oxidation process of said second dielectric layer, said substrate, said second conductive layer and said third conductive layer comprises an in situ steam generated oxidation process.

7. The method according to claim 1, wherein said fourth dielectric layer comprises a silicon dioxide layer.

8. The method according to claim 1, wherein said fourth conductive layer comprises a polysilicon layer.

9. A method for forming an integrated circuit having metal-oxide nitride-oxide semiconductor memories and mixed-signal circuits, said method comprising:

providing a substrate having an array region having a first silicon dioxide layer, a silicon nitride layer and a second silicon dioxide layer stacked in sequence and a periphery region having said first silicon dioxide layer thereon;

forming a first conductive layer over said array region and said periphery region;

forming a photoresist layer over said array region;

implanting dopant ions into said first conductive layer;

removing said photoresist layer;

patterning to etch said first conductive layer to form a second conductive layer and a third conductive layer on said periphery region;

removing said second silicon dioxide layer to expose said silicon nitride layer;

removing said exposed first silicon dioxide layer on said periphery region to expose said substrate;

oxidizing said silicon nitride layer, said substrate, said second conductive layer and said third conductive layer to form a third silicon dioxide layer therein;

forming a fourth conductive layer over said third silicon dioxide layer; and patterning to etch said fourth conductive layer to form a fifth conductive layer on said array region and a sixth conductive layer on said third silicon dioxide layer and said third conductive layer.

10. The method according to claim 9, wherein said first conductive layer comprises a polysilicon layer.

11. The method according to claim 9, wherein said dopant ions comprise n-type dopant ions.

12. The method according to claim 9, wherein said dopant ions comprise p-type dopant ions.

13. The method according to claim 9, wherein the oxidation process of said silicon nitride layer, said substrate, said second conductive layer and said third conductive layer comprises an in situ steam generated oxidation process.

14. The method according to claim 9, wherein said fourth conductive layer comprises a polysilicon layer and $WSi_x$.

15. A method for forming an integrated circuit having metal-oxide nitride-oxide semiconductor memories and mixed-signal circuits, said method comprising:

providing a substrate having an array region having a first silicon dioxide layer, a silicon nitride layer and a second silicon dioxide layer stacked in sequence and a periphery region having said first silicon dioxide layer thereon;

forming a first conductive layer over said array region and said periphery region;

forming a photoresist layer over said array region;

implanting dopant ions into said first conductive layer;

removing said photoresist layer;

patterning to etch said first conductive layer to form a second conductive layer and a third conductive layer on said periphery region;

removing said second silicon dioxide layer to expose said silicon nitride layer;

removing said exposed first silicon dioxide layer on said periphery region to expose said substrate;

oxidizing said silicon nitride layer, said substrate, said second conductive layer and said third conductive layer to form a third silicon dioxide layer therein by an in situ steam generated oxidation process;

forming a fourth conductive layer over said third silicon dioxide layer; and patterning to etch said fourth conductive layer to form a fifth conductive layer on said array region and a sixth conductive layer on said third silicon dioxide layer and said third conductive layer.

16. The method according to claim 15, wherein said first conductive layer comprises a polysilicon layer.

17. The method according to claim 15, wherein said dopant ions comprise n-type dopant ions.

18. The method according to claim 15, wherein said dopant ions comprise p-type dopant ions.

19. The method according to claim 15, wherein said fourth conductive layer comprises a polysilicon layer and $WSi_x$.

20. The method according to claim 15, wherein said fourth conductive layer is formed by a low pressure chemical vapor deposition process.

* * * * *